United States Patent
Chakraborty et al.

(10) Patent No.: US 9,331,734 B2
(45) Date of Patent: May 3, 2016

(54) SOC TRANSCEIVER WITH SINGLE ENDED/DIFFERENTIAL MODES, TUNABLE CAPACITOR AND LATCH

(71) Applicants: Texas Instruments Incorporated, Dallas, TX (US); TEXAS INSTRUMENTS DEUTSCHLAND GmbH, Freising (DE)

(72) Inventors: Sudipto Chakraborty, Plano, TX (US); David LeDeaut, Nuremberg (DE); Josef Einzinger, Georgensgmuend (DE); Jens Graul, Freising (DE); Vadim Valerievich Ivanov, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/740,961

(22) Filed: Jun. 16, 2015

(65) Prior Publication Data

US 2015/0280772 A1 Oct. 1, 2015

Related U.S. Application Data

(63) Continuation of application No. 13/748,008, filed on Jan. 23, 2013, now Pat. No. 9,088,334.

(51) Int. Cl.
*H04B 1/40* (2015.01)
*H04B 1/401* (2015.01)
*H04B 1/04* (2006.01)
*H04B 1/18* (2006.01)

(52) U.S. Cl.
CPC .............. *H04B 1/401* (2013.01); *H04B 1/0458* (2013.01); *H04B 1/18* (2013.01); *H04B 2001/0408* (2013.01)

(58) Field of Classification Search
CPC ................................ H04B 1/0458; H04B 1/18
USPC ........................................................... 455/77
See application file for complete search history.

(56) References Cited

U.S. PATENT DOCUMENTS

| 2008/0079650 | A1* | 4/2008 | Constantinidis | ....... H01Q 7/005 343/858 |
| 2014/0176242 | A1* | 6/2014 | Lin | .......................... H03H 7/38 330/277 |

* cited by examiner

*Primary Examiner* — Ajibola Akinyemi
(74) *Attorney, Agent, or Firm* — Lawrence J. Bassuk; Frank D. Cimino

(57) ABSTRACT

A system on a chip (SoC) includes a transceiver comprising a transmitter and a receiver, wherein at least one of the transmitter and receiver has a configurable portion that can be configured to operate in a single ended mode and in a differential mode. Two interface pins are provided for coupling the transceiver to an antenna via a matching network, wherein the two interface pins are shareably coupled to the transmitter and to the receiver. A tunable capacitor is coupled to differential signal lines of the configurable portion, wherein the tunable capacitor is configured to be tuned to optimize impedance matching of the configurable portion for each mode of operation.

6 Claims, 8 Drawing Sheets

SOC TRANSCEIVER WITH SINGLE ENDED/DIFFERENTIAL MODES, TUNABLE CAPACITOR AND LATCH

This Application is a continuation of application Ser. No. 13/748,008, filed Jan. 23, 2013, now U.S. Pat. No. 9,088,334, issued Jul. 21, 2015.

FIELD OF THE INVENTION

Embodiments of this invention generally relate to transceivers for radio frequency transmissions, and in particular, to optimization of impedance matching within a transceiver.

BACKGROUND OF THE INVENTION

System on Chip (SoC) is a concept that has been around for a long time; the basic approach is to integrate more and more functionality into a given device. This integration can take the form of either hardware or solution software. Many SoC designs pair a microprocessor core, or multiple cores, with various peripheral devices and memory circuits.

A radio frequency (RF) transceiver may be included within a SoC, and may include fully integrated CMOS Low noise amplifiers (LNAs) and power amplifiers (PAs). Differential circuits are often chosen to reduce the effect of ground noise in LNA circuits and double the output power level for PAs under the same supply voltage. However, antennas are often single-ended and therefore a matching network to transform impedance may be required to interface the single-ended antenna to differential circuits on-chip.

The Bluetooth standard was designed to achieve cost effective wireless communications providing a data rate of 1 Mb/s at 10 m distance. Destined to be primarily a flexible cable replacement, growth in the Bluetooth arena has mushroomed. The specifications for the standard have been relaxed in order to facilitate a fully integrated chipset solution. Therefore this standard is very suitable for an SoC approach. Several platforms are already available on the market for Bluetooth SoC rapid development and prototyping to shorten design cycles and limit the scope of design teams. A Bluetooth RF transceiver requires several system components: a quadrature frequency synthesizer, a low noise amplifier (LNA), mixers to provide frequency translation from RF frequencies to baseband, and amplifiers.

BRIEF DESCRIPTION OF THE DRAWINGS

Particular embodiments in accordance with the invention will now be described, by way of example only, and with reference to the accompanying drawings.

Figure 1:
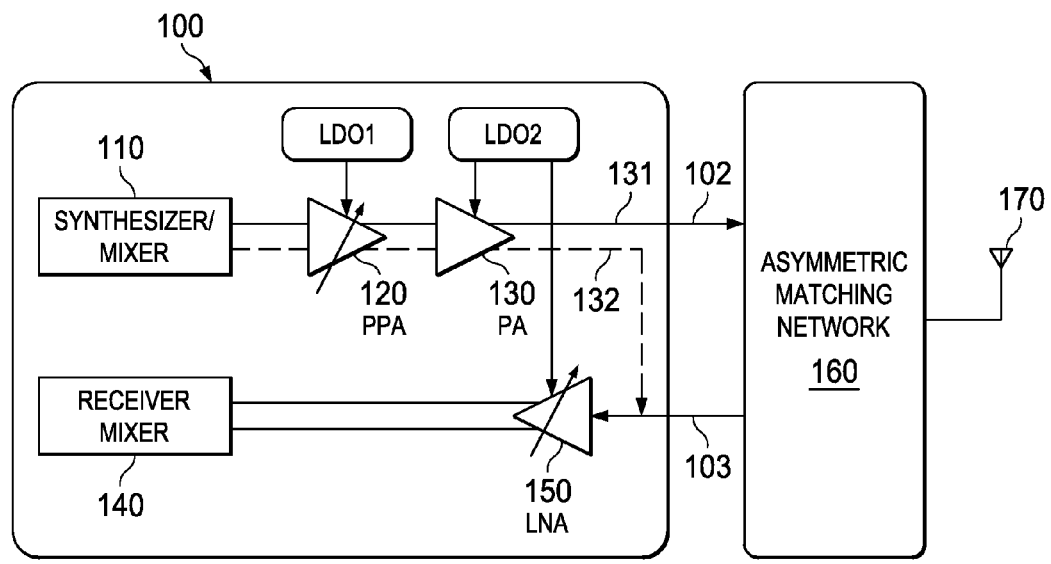
FIG. 1 is a functional block diagram of a portion of a transceiver in a system on chip (SoC) that includes an embodiment of the invention.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Embodiments of the invention provide a front-end that can be reconfigured between single ended and differential configurations and optimized for each configuration. The PA stages may use self-biased class-AB topology. In one embodiment, the receiver LNA (low noise amplifier) is single ended, while PA is differential, hence the name "asymmetric". For another application, the LNA can also be configured to be differential. This approach allows a common front end design to be used in one application with minimum external components using a single ended PA; and be used in another application by adding two more components to get 3 dB (theoretical) higher output power using a differential PA.

In high volume and low cost markets, low external component count is preferred because a fewer number of components makes it simpler to handle the end solution and evaluation module finish up and therefore requires less time for time to market for customers. Providing a configurable transceiver front end offers flexibility to an end user by allowing a variety of antenna designs to be easily interfaced to the transceiver.

Hence, a front-end that can be reconfigured between single ended and differential configurations is desirable. A single ended RF can be used with single ended LNA and single ended PA (power amplifier) requires lower external component count (lower cost). A differential front-end interface can provide the capability of combining output power from two TXPA (transmitter power amplifier) outputs, thereby leading to theoretically 3 dB higher Pout (output power) than the single ended interface. This power combination allows the PA stages to be operated from a lower supply voltage, and hence, the supply voltage does not need to go higher in order to deliver higher power. This can then be compatible with a DCDC converter, leading to further efficiency.

Low cost, low power transceivers require a minimum number of external components while providing a reasonable voltage conversion gain to save current in RF (radio frequency) front-ends and meeting strict requirement of transmit spectrum mask. In many applications, customers prefer the lowest possible external BOM (bill of materials) as well as large filtering of out-of band harmonics of RF signal. Modern transceivers previously required multiple matching network components to achieve this. A highly efficient switching PA usually generates harmonics, which requires many external high Q (quality factor) components to filter out, and may require an additional filter stage, leading to large system cost. Quality factor, also referred to as Q factor, is a dimensionless parameter that describes how under-damped an oscillator or resonator is, or equivalently, characterizes a resonator's bandwidth relative to its center frequency. Higher Q indicates a lower rate of energy loss relative to the stored energy of the resonator; therefore, the oscillations die out more slowly. Higher Q also means smaller resistive losses occur within the matching network, which results in higher output power from the transmitter reaching the antenna, and a stronger received signal reaching the receiver which thereby improves receiver sensitivity.

Differential RF signaling is preferred on-chip due to substrate cross-talk and other common mode noise issues. However, a differential front-end requires differential matching networks, and eventually they need to be connected via passive L/C components to make a single ended interface to antenna.

Embodiments of the invention incorporates the following solutions to achieve low cost, low power transceiver front-ends FIG. 1 is a functional block diagram of a portion of a transceiver in a system on chip (SoC) 100 that includes an embodiment of the invention. In addition to the transceiver, which will be described in more detail herein, the SoC may contain other system components such as a processor and memory, various peripheral devices, timers, controllers, etc, the are well known. This embodiment combines the advantages of single ended RX front-end 140 and differential TX front-end 120, 130. Interface pins 102, 103 couple two transceivers signals from SoC 100 to matching network 160 which in turn couples to antenna 170. Synthesizer and mixer circuit 110 synthesizes a radio frequency from a reference frequency, mixes in data to be transmitted, and provides the modulated RF signal to preamp (PPA) 120, which is further amplified by PA 130 and then transmitted on antenna 170. RF signals received on antenna 170 are amplified by LNA 150 and then coupled to receiver mixer circuit 120 for demodulation.

Single ended LNA 150 provides superior linearity per unit current consumption, while differential PA structure 130 allows the possibility of obtaining higher output power by combining two low power differential terminals on SoC interface pins 102, 103. Transmitter front-end preamp 120 and power amp 130 utilize two-stage, self biased class-AB amplifiers, which can be programmed to operate in a fully differential mode for higher output power and improved filtering, as well as in a single ended mode for lower output power. The two stages can be independently programmed for controlling output power, and the levels of output harmonics. Output terminal 132 of the class AB stage is connected directly to the RX LNA 150 input and then connected to the ESD (electrostatic discharge protection) and matching network via SoC interface pin 102. A second output terminal 131 of PA 130 is connected to ESD and matching network 160 via SoC interface pin 103. LNA 150 utilizes a cascode topology with transformer loading for single ended to differential conversion.

Bluetooth uses a radio technology called frequency-hopping spread spectrum, which chops up the data being sent and transmits chunks of it on up to 79 bands (1 MHz each; centered from 2402 to 2480 MHz) in the range 2,400-2,483.5 MHz (allowing for guard bands). This range is in the globally unlicensed Industrial, Scientific, and Medical (ISM) 2.4 GHz short-range radio frequency band. It usually performs 800 hops per second, with Adaptive Frequency-Hopping (AFH) enabled. Originally Gaussian frequency-shift keying (GFSK) modulation was the only modulation scheme available; subsequently, since the introduction of Bluetooth 2.0+EDR, π/4-DQPSK and 8 DPSK modulation may also be used between compatible devices. Devices functioning with GFSK are said to be operating in basic rate (BR) mode where an instantaneous data rate of 1 Mbit/s is possible. The term Enhanced Data Rate (EDR) is used to describe π/4-DPSK and 8 DPSK schemes, each giving 2 and 3 Mbit/s respectively. The combination of these (BR and EDR) modes in Bluetooth radio technology is classified as a "BR/EDR radio". Various embodiments of the transceiver of FIG. 1 may be designed to support these versions of Bluetooth, as well as other transmission standards.

Figure 2:
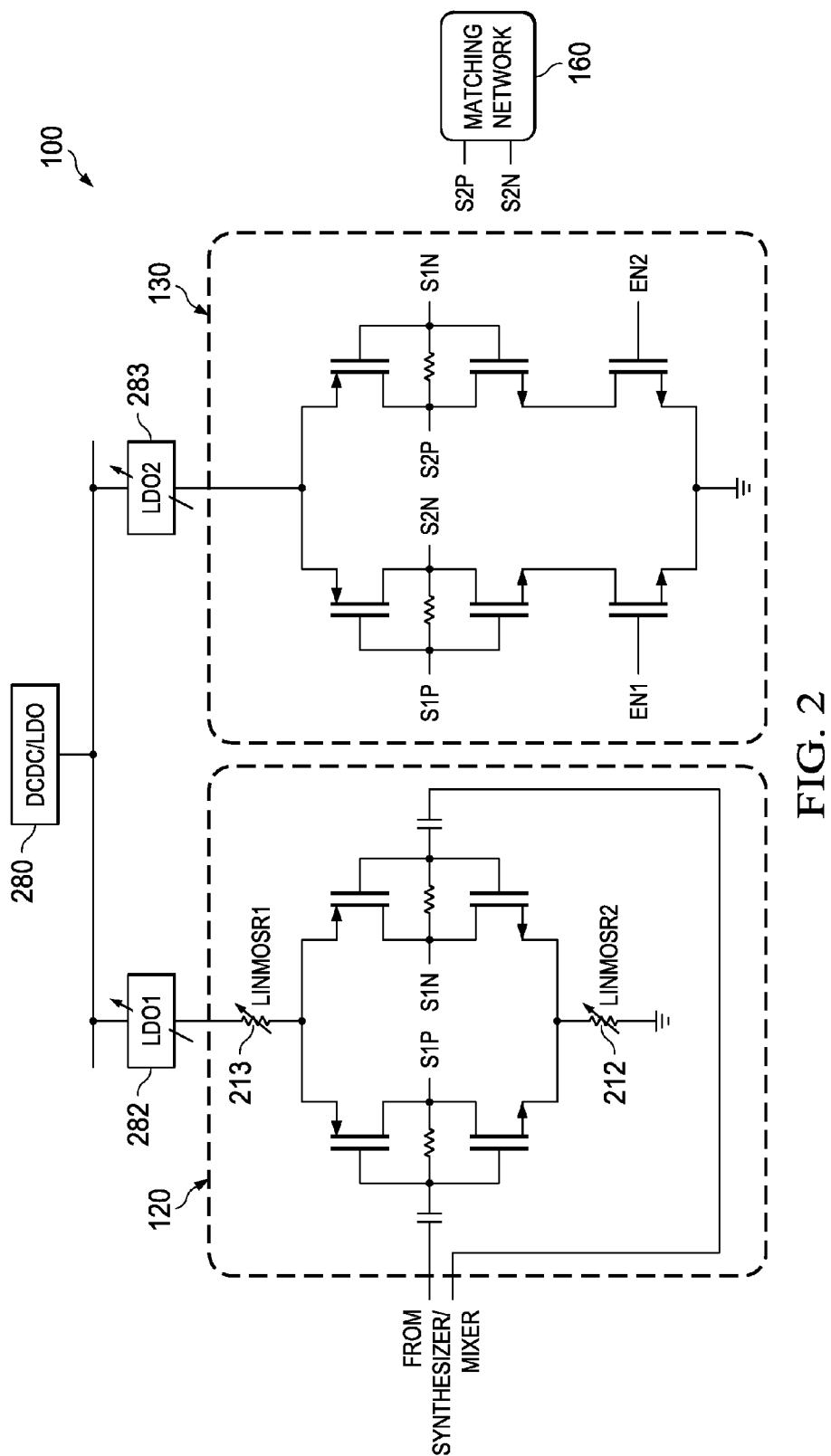
FIG. 2 is a schematic of a self-biased class AB TX driver used in the transceiver of FIG. 1.

FIG. 2 is a schematic of PPA 120 and PA 130 illustrating the self-biased class AB TX drivers used in each one. In a class A amplifier, 100% of the input signal is used. The active element remains conducting and is biased to work in its "linear" range all of the time. Where efficiency is not a consideration, most small signal linear amplifiers are designed as class A. Class-A amplifiers are typically more linear and less complex than other types, but are very inefficient. This type of amplifier is most commonly used in small-signal stages or for low-power applications, such as driving headphones. In a class B amplifier, 50% of the input signal is used and the active element works in its linear range half of the time and is more or less turned off for the other half. In most class B amplifiers, there are two output devices, or sets of output devices, each of which conducts alternately (push-pull) for exactly 180° (or half cycle) of the input signal. These amplifiers are subject to crossover distortion if the transition from one active element to the other is not perfect.

A class AB amplifier is intermediate between class A and B, with better power efficiency than class A and less distortion than class B. The two active elements conduct more than half of the time, producing less cross-over distortion than class-B amplifiers. In this embodiment, preamp 120 is implemented by using self biased class-AB stage with current limiting resistors 212, 213 implemented using an MOS transistor in a linear region. The on-resistance of linear MOS resistors 212, 213 may be controlled by a program executed on a processor within SoC 100 by using a digital codeword to select the gate voltage generated by a string of bias resistors. Using a MOS transistor as a linear variable resistor allows selection of a wide range of resistance. Since the resistance value of the bias resistors is high, power dissipation contributed by the control portion of variable linear MOS resistors 212, 213 is minimized. Also, overall area required for an active MOS variable resistor is less than that required for a variable passive resister. The gain of preamp 120 may be programmed in this manner under control of a software routine executed by a processor included within SoC 100, for example. There are no switching elements in the signal path of the transmitter, leading to a low power implementation. DC to DC converter 280 provides a supply voltage that is used by various modules within SoC 100. Stages 120, 130 are supplied by separately programmable regulators 282, 283, which can be adjusted independently to optimize current consumption and harmonics. Regulators 282, 283 may be programmed in a similar manner to linear MOS resistors 212, 213 under control of a software routine executed by a processor included within SoC 100, for example. Using these controls, the transmitter can be configured for highly linear or highly nonlinear operation, depending on the end application requirements. This suits the need for a variety of emerging standards with demanding modulation techniques.

Figure 3:
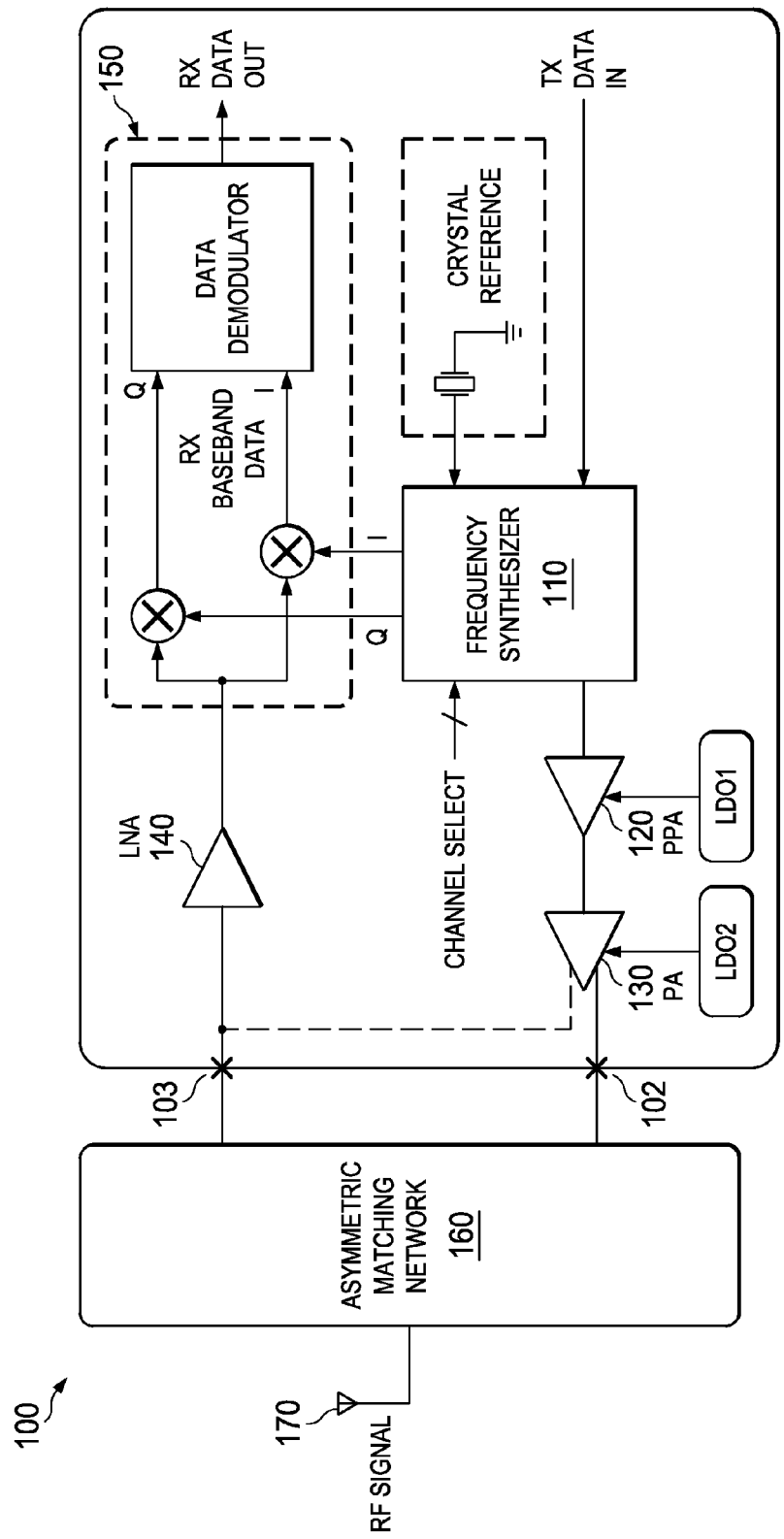
FIG. 3 is a more detailed block diagram of a transceiver module used in the SoC of FIG. 1.

FIG. 3 is a more detailed block diagram of the transceiver module used in the SoC of FIG. 1. A Bluetooth RF transceiver requires several system components: a quadrature frequency synthesizer 110, a low noise amplifier (LNA) 140, mixer 150 to provide frequency translation from RF frequencies to baseband, and amplifiers 120, 130. Frequency synthesizer 110 may also include a modulator and upmixer, or it may be implemented using a direct modulation architecture in which the data to be transmitted is sent directly to the synthesizer. The general operation of a quadrature frequency synthesizer and mixers is known, and therefore will not be described in further detail herein. For example, see "A 0.18 um CMOS Bluetooth Frequency Synthesizer for Integration with a Bluetooth SOC Reference Platform", Bogdan Georgescu, et al, 2003, which is incorporated by reference herein.

Figure 4:
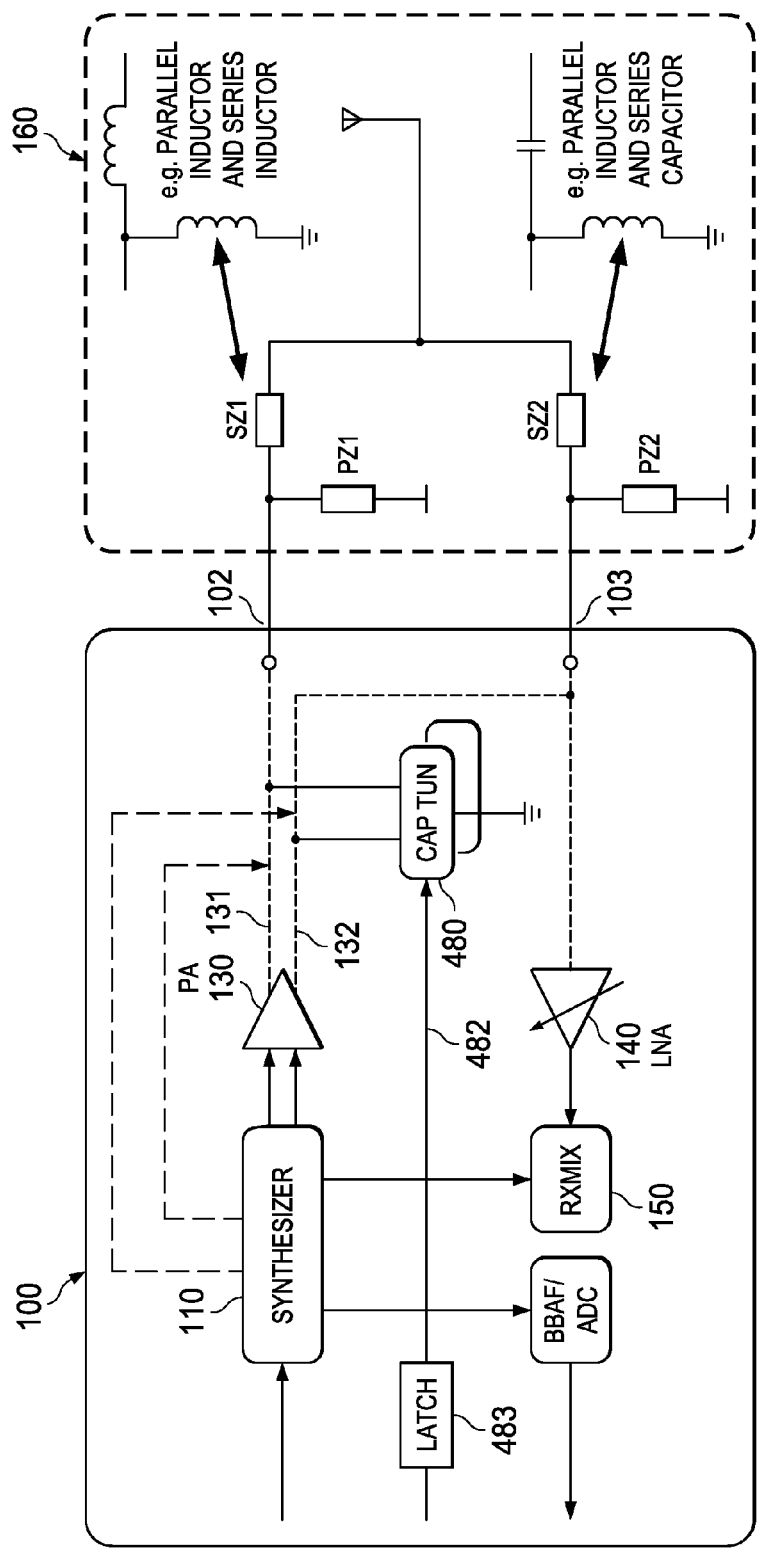
FIG. 4 is a schematic illustrating details of the asymmetric matching circuit of Figure.

FIG. 4 is a schematic illustrating details of the asymmetric matching circuit 160. Due to the difference in loading on each interface pin 102, 103, matching network 160 is asymmetric in nature. The network includes two matching network elements, which are not necessary identical or symmetrical. One network element matches the output impedance of TX PA 130 and the other network element matches the input impedance of RX LNA 140 to the typical 50 Ohms of the antenna. Each of these network elements may comprise a parallel impedance element (PZ) and a series impedance element (SZ). The series elements are on the antenna side and are connected together and match the antenna impedance, which is typically 50 ohms. Many combinations are possible to match the load: L shunt-C series; C shunt-L series; C shunt-C series; etc. One network matches the RX LNA input impedance and the other the TX PA output impedance. The TX PA matching network is also optimized to acquire higher output power of the differential TX PA. In the FIG. 4, two examples of matching networks are given; PZ1-SZ1 is an LL combination, while PZ2-PS2 is an LC combination. In one example, the following component values may be used: PZ1=0.1 pf, PS1=1.3 pf, PZ2=2.2 pf, and PS2=1.1 pf. However, as discussed above, many other combinations are possible.

Referring again to FIG. 4, tuning capacitors 480 are coupled to the outputs of PA 130 and are tuned to optimize the matching of external matching network 160 to power amplifier 130. Tuning is performed in response to control signals 482 which may come from a register or latch 483 that is written by a software program executed by a processor on SoC 100, for example. One tuning capacitor 480 is coupled between output 131 of PA 130 and ground, while another tuning capacitor 480 is coupled between output 132 of PA 130 and ground. In some embodiments, a single tuning capacitor may be coupled between outputs 131, 132.

Figure 5:
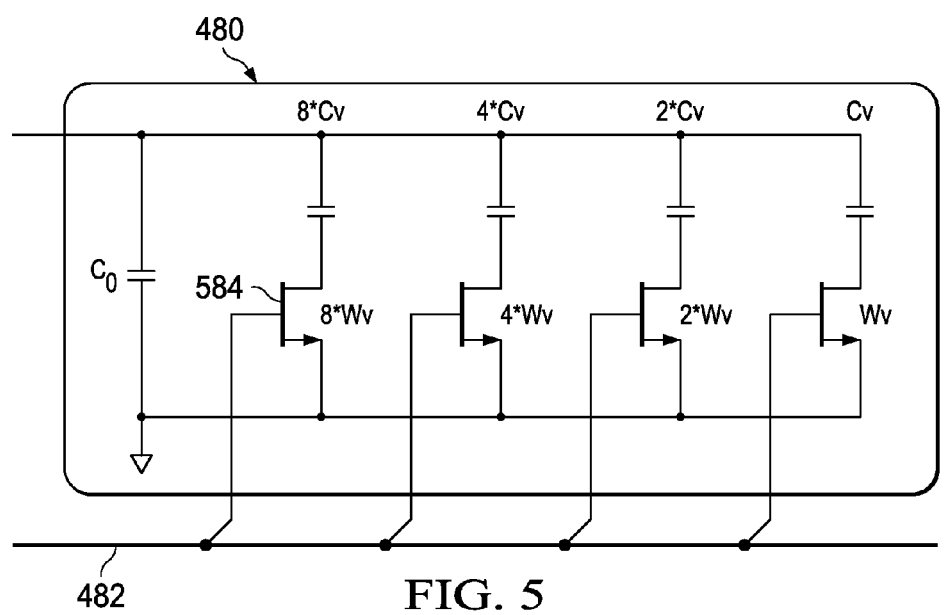
FIG. 5 is a more detailed schematic of a tuning capacitor.

FIG. 5 is a more detailed schematic of tuning capacitor 480. One base capacitor segment $C_o$ and four variable capacitor segments $C_v$ are illustrated here, but other embodiments may have more or fewer variable segments. Each variable segment is enabled by a switch 584 that is controlled by control signal 482. In this embodiment, each tuning capacitor 480 may be tuned across a range of approximately 80 fempto-farads to approximately 1 pico-farad.

Tuning capacitors 480 provide a way to compensate for variations in component values in matching network 160 and in process variations that occur during the manufacture of SoC 100. Tuning capacitor 480 also allows matching to be optimized for both differential operation of PA 130 and single ended operation of PA 130. When operated in single ended mode, output 132 is from PA 130 is disabled and tied to ground, but DC flow is blocked by a coupling capacitor (not shown).

Tuning may be done anytime, such as at power up of SoC 100, or during operation of SoC to compensate for temperature effects, etc. Typically, the operating mode of PA 130 will remain fixed for a given application; however, some applications may operate PA 130 in single ended mode for a portion of time and then a control program being executed by a processor on SoC may reconfigure PA 130 to operate in differential mode for a period of time, and vise versa. Each time PA 130 is reconfigured from single ended to differential and from differential to single ended, tuning capacitors 480 may be tuned to optimize impedance matching.

Tuning may be performed under control of a software program executed by a processor on the SoC by sending a digital command to transmitter synthesizer 110 to generate a test signal tone having a known frequency, which then produces an RF signal modulated by the known magnitude test tone. In this embodiment, transmitter synthesizer 110 is configured to generate the test tone derived from a crystal reference signal in response to a command from the processor. Other embodiments may use other techniques for generating a test tone and then provide the test tone to the transmitter for use during calibration.

While power amplifier 130 is outputting the RF signal modulated by the test signal, receiver module 150 may monitor the output RF signal and determine the signal strength of the output RF signal. The software program may then cause the value of tuning capacitors 480 to be tuned across their range until a maximum signal level is determined at receiver 150. Once a maximum signal level is determined, each of the tunable capacitors 480 may be set to the value that produced the maximum signal strength.

Figure 6:
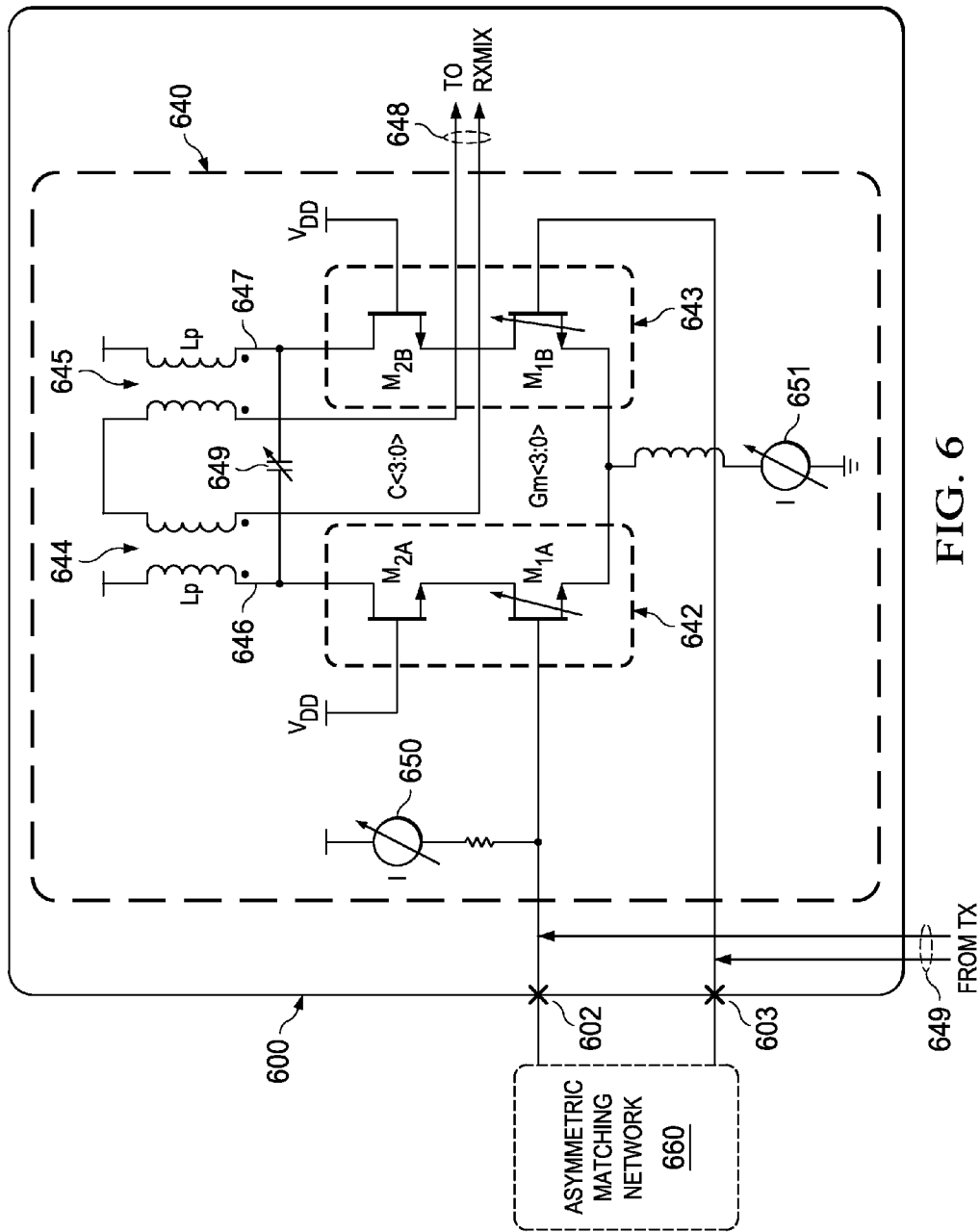
FIGS. 6 and 7 are schematics of embodiments of a configurable receiver LNA.

FIG. 6 is a schematic of an embodiment of a configurable differential receiver LNA 640 that is included in transceiver on a SoC 600. SoC 600 may be similar to SoC 100, for example. LNA 640 is included within a transceiver that may be similar to the transceiver illustrated in FIG. 3, for example. Asymmetrical matching network 660 may be similar to asymmetrical matching network 160, for example.

LNA 640 is a differential amplifier and therefore has two low power amplifier sections 642, 643, each connected to one of SoC interface pins 602, 603 and thereby to asymmetrical matching network 660. The gain of each low power amplifier section 642, 643 may be adjusted by current source 650 that provides gate control or current source 651 that provides tail control. In some implementations, tail control current source 651 may be omitted. Amplifier 642 is coupled to a primary coil of transformer 644 and amplifier 643 is coupled to a primary coil of transformer 645. The coils of transformer 644, 645 may be implemented by a coil shaped pattern of conductors on a substrate of SoC 600, for example. The secondary coils of transformers 644, 645 are connected together and thereby form a differential transformer that provides a differential signal 648 that is then provided to the receiver/mixer. In this embodiment, the output of a single ended power amplifier from the transmitter may be coupled to either SoC interface pin 602, 603. Since the receiver is differential, and the transmitter is single ended, an asymmetrical matching network is required, as discussed above.

In this embodiment, tunable capacitor 649 is coupled across nodes 646, 647, which are the signals that couple low power amplifier sections 642, 643 to transformers 644, 645. Tuning capacitor 649 may be configured in a similar manner to tuning capacitor 480 and controlled by a control word written to a control register by a processor on SoC 600, for example. Tuning capacitor 649 may be used to optimize impedance matching between LNA 640 and the receiver to which it is coupled. Tuning may be performed under control of a software program executed by a processor on the SoC by injecting a test signal tone having a known magnitude into the transmitter synthesizer, which then produces a modulated RF signal. While the power amplifier is outputting the RF signal modulated by the test signal, LNA 640 may monitor the output RF signal and pass it to the receiver. The receiver may then determine the signal strength of the output RF signal. The software program may then cause the value of tuning capacitor 649 to be tuned across its range until a maximum signal level is determined at the receiver. Once a maximum signal level is determined, tunable capacitor 649 may be set to the value that produced the maximum signal strength.

In another embodiment, there may be two tunable capacitors 649, in which one tunable capacitor is coupled between node 646 and a ground reference and the other tunable capacitor is coupled between node 647 and the ground reference. In such an embodiment, one or both of LNA amplifier sections 642, 643 may be configurable to allow LNA 640 to operate in either a differential mode or in a single ended mode. In this case, the two tunable capacitors may be tuned to optimize impedance matching between LNA 640 and the receiver for both modes of operation.

Figure 7:
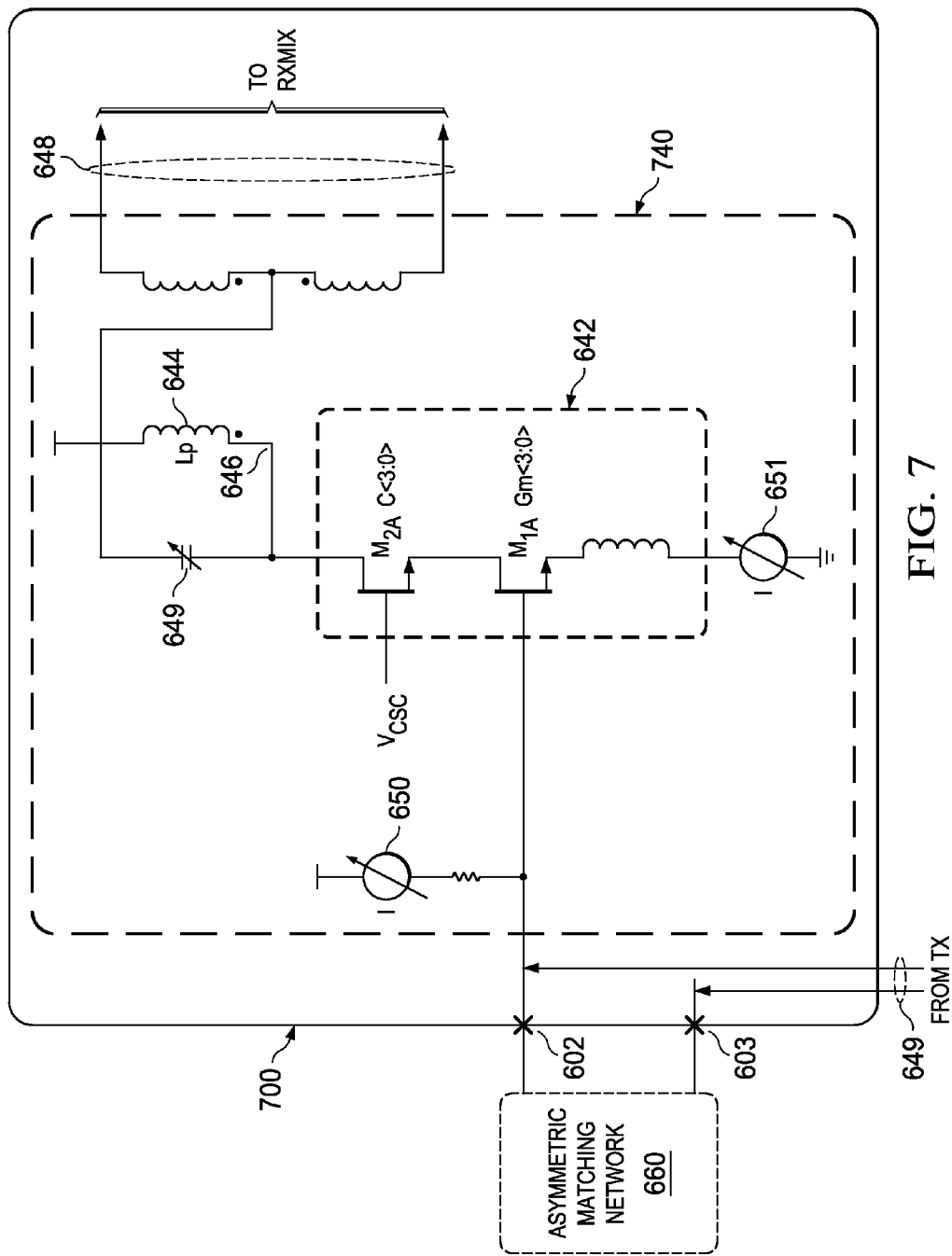

FIG. 7 is a schematic of an embodiment of a configurable single-ended receiver LNA 740 that is included in transceiver on a SoC 700. SoC 700 may be similar to SoC 100, for example. Receiver 740 may be tuned using tunable capacitor 649 in the same manner as described for receiver 640. In some embodiments, differential receiver 640 may be configured to operate as single-ended receiver 740 by disabling LNA 643. Asymmetrical matching network 660 is similar to the asymmetrical matching networks described earlier and allows digital radio 700 to be configured to have a differential RX/TX, a single ended RX/TX, a single ended RX with a differential TX, or a differential RX with a single ended TX to match a particular application, as described in more detail above.

Figure 8:
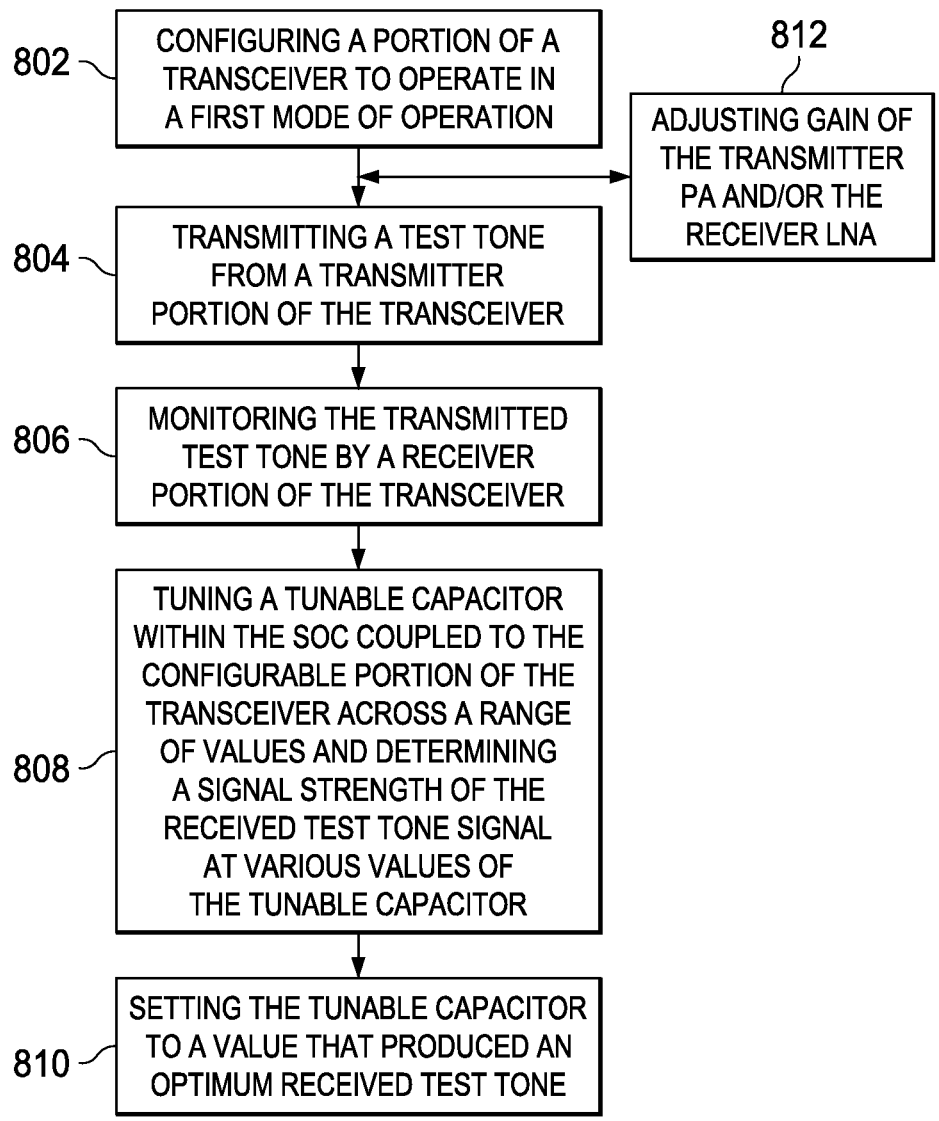
FIG. 8 is a flow diagram illustrating configuration of a transceiver with an asymmetric matching network.

FIG. 8 is a flow diagram illustrating tuning of a transceiver with an asymmetric matching network. At some point in time, such as at power up of the SoC containing the transceiver, or during continuing operation of the SoC when an application being executed by a processor on the SoC has a need to change the operating mode of the transceiver, a configurable portion of the transceiver may be configured 802 to operate in a first mode of operation. For example, the power amplifier of the transmitter may be configured to operate in a single ended mode of operation for lower power operation, but may be configured to operate for a while in a differential mode of operation to provide increased transmission power. Similarly, the receiver LNA may be configured to operate in either a single ended mode of operation or in a differential mode of operation.

A test tone may be transmitted 804 from a transmitter portion of the transceiver via an antenna coupled to the SoC via a matching network. The matching network may be an asymmetrical matching network, as describe in more detail above.

The transmitted test tone may be monitored 806 by a receiver portion of the transceiver to produce a received test tone signal. During normal operation, the receiver is turned off while the transmitter is operating. Since a transmitter output signal is coupled directly to the receiver LNA input, the output signal could swamp the input of the LNA. To avoid this, the output signal level of the power amplifier is biased so as not to break down the semiconductor devices of the LNA. During calibration of the tunable capacitors, the gain of the power amp may be reduced to allow the receiver to monitor the transmitter signal without being swamped.

A tunable capacitor within the SoC coupled the configurable portion of the transceiver may be tuned 808 across a range of values. While the capacitor is being tuned, a signal strength of the received test tone signal may be determined for various values of the tunable capacitor. As described in more detail above, the tunable capacitor is configured to optimize impedance matching of the configurable portion for each mode of operation.

The tunable capacitor is then set 810 to a value that produced an optimum received test tone.

In some embodiments, the gain of the transmitter power amplifier may be adjustable, and/or the gain of the low noise amplifier of the receiver may be adjustable. In this case, the gain may be adjusted 812 and the processes of optimizing the received tone may be performed at the selected gain level.

In this embodiment, a microprocessor is controllably coupled to the power amplifier and to the tunable capacitor. Code executed by the microprocessor is operable to configure the power amplifier as either a single ended power amplifier or a differential power amplifier and to adjust the tunable capacitor to optimize impedance matching between the power amplifier and the antenna in either configuration. Similarly, code executed by the microprocessor may be operable to configure the low noise amplifier as either a single ended low noise amplifier or a differential low noise amplifier and to adjust a tunable capacitor coupled to the low noise amplifier to optimize impedance matching between the low noise amplifier and the receiver.

This process may also be performed each time the SoC is booted up after a power off period. By optimizing the setting of the tunable capacitors each time the SoC is powered on, effects from aging of components can be compensated, for example.

System Example

Figure 9:
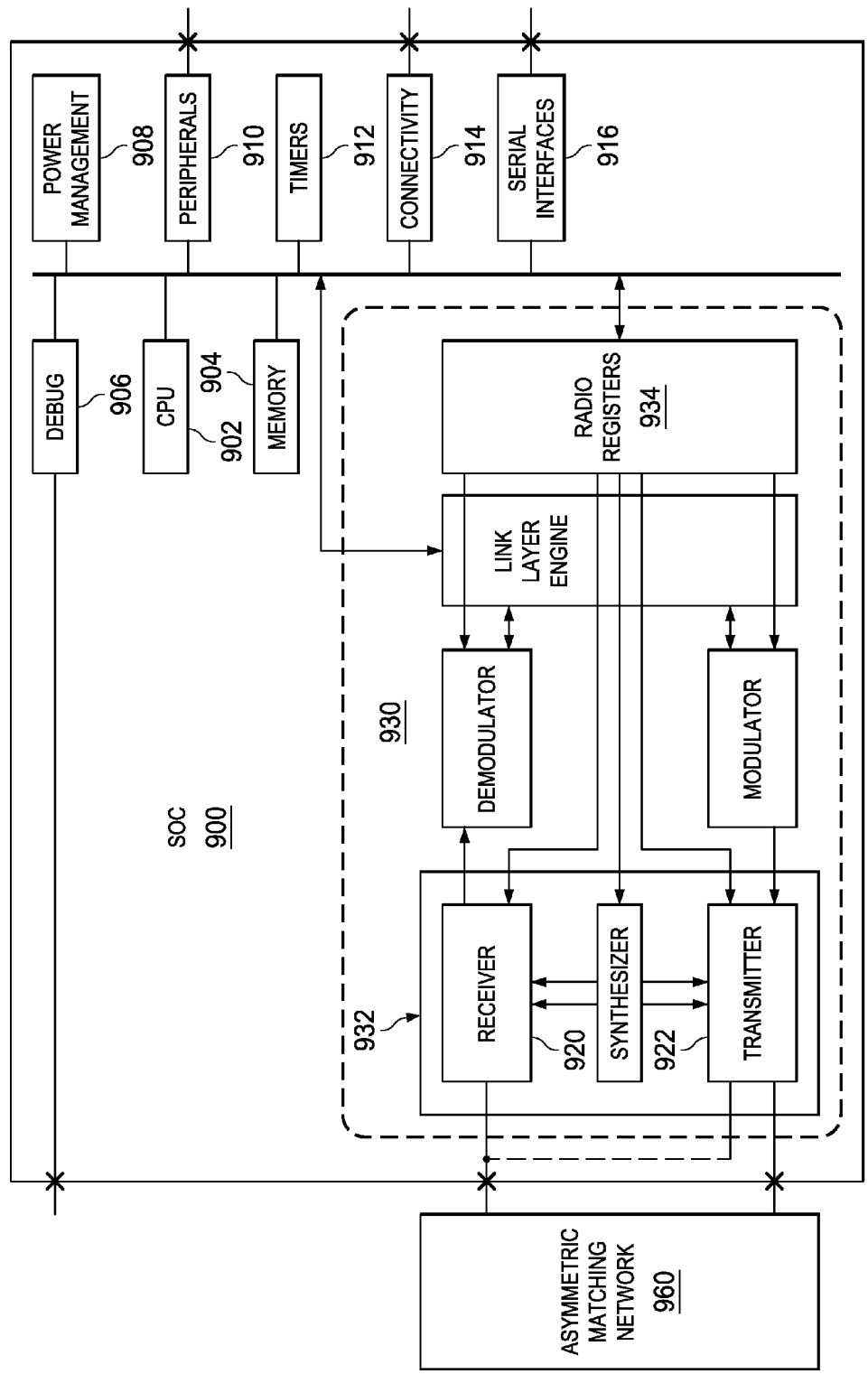
FIG. 9 is a block diagram of an example SoC that includes a configurable transceiver.

FIG. 9 is a block diagram of an example SoC 900 that includes digital radio 930 that includes a configurable transceiver 932. Configurable transceiver 932 includes one or more tuning capacitors as described in more detail above that may be configured by writing control words into radio control registers 934. A software application stored in memory 904 and executed by processor 902 may control and configure the digital radio as needed by applications executed thereon. The general operation of a Bluetooth radio is known, and therefore will not be described in further detail herein. Asymmetrical matching network 960 is similar to the asymmetrical matching networks described earlier and allows digital radio 930 to be configured as a differential RX/TX, a single ended RX/TX, a single ended RX with a differential TX, or a differential RX with a single ended TX to match a particular application, as described in more detail above.

SoC 900 includes additional system components to provide a complete system on a chip. Debug interface 906 implements a two-wire serial interface that is used for in-circuit debugging. Through this debug interface, it is possible to erase or program the entire flash memory 904, control which oscillators are enabled, stop and start execution of the user program, execute instructions on the processor core 902, set code breakpoints, and single-step through instructions in the code. Using these techniques, it is possible to perform in-circuit debugging and external flash programming elegantly.

I/O controller 914 is responsible for all general-purpose I/O pins. CPU (central processing unit) 902 can configure whether peripheral modules control certain pins or whether they are under software control, and if so, whether each pin is configured as an input or output and if a pullup or pulldown resistor in the pad is connected. Each peripheral that connects to the I/O pins can choose between two different I/O pin locations to ensure flexibility in various applications.

Various timers 912 may be included. A sleep timer is an ultralow-power timer that may either use an external 32.768-kHz crystal oscillator or an internal 32.753-kHz RC oscillator. The sleep timer runs continuously in all operating modes except power mode 3. Typical applications of this timer are as a real-time counter or as a wake-up timer to get out of power mode 1 or mode 2.

A built-in watchdog timer allows SoC 900 to reset itself if the firmware hangs. When enabled by software, the watchdog timer must be cleared periodically; otherwise, it resets the device when it times out. Additional timers may be provided for use in timing, counting, and pulse width modulation tasks.

Serial interfaces 912 may include a USART 0 and USART 1 (universal serial asynchronous receiver/transmitter) that are each configurable as either an SPI master/slave or a UART. They provide double buffering on both RX and TX and hardware flow control and are thus well suited to high-throughput full-duplex applications. Each USART has its own high-precision baud-rate generator, thus leaving the ordinary timers free for other uses. When configured as SPI slaves, the USARTs sample the input signal using SCK (system clock) directly instead of using some oversampling scheme, and are thus well-suited for high data rates.

Various peripherals 910 may be included within SoC 900. For example, in some embodiments there may be an AES encryption/decryption core that allows the user to encrypt and decrypt data using the AES algorithm with 128-bit keys. The AES core may also supports ECB, CBC, CFB, OFB, CTR, and CBC-MAC, as well as hardware support for CCM.

An analog to digital converter may be included. For example, an ADC may support 7 to 12 bits of resolution with a corresponding range of bandwidths from 30-kHz to 4-kHz, respectively. DC and audio conversions with up to eight input channels (I/O controller pins) are possible. The inputs can be selected as single-ended or differential. The reference voltage can be internal, AVDD, or a single ended or a differential external signal. The ADC may also have a temperature-sensor input channel. The ADC can automate the process of periodic sampling or conversion over a sequence of channels.

Other combinations of known and later developed peripherals and support modules may be included in various embodiments of SoC 900.

Other Embodiments

Although the invention finds particular application to microcontrollers implemented, for example, in a System on a Chip (SoC), it also finds application to other forms of processors. A SoC may contain one or more megacells or modules which each include custom designed functional circuits combined with pre-designed functional circuits provided by a design library.

While the invention has been described with reference to illustrative embodiments, this description is not intended to be construed in a limiting sense. Various other embodiments of the invention will be apparent to persons skilled in the art upon reference to this description. For example, an embodiment described herein was implemented in 130 nm CMOS, but is scalable with respect to technology of implementation as well as the RF center frequencies of common wireless standards and frequency bands.

While the embodiments described herein place the matching network external to the SoC, system that operate at higher frequencies may be able to include the matching network components internal to the SoC since the components may be smaller at higher frequencies.

While Bluetooth transceivers have been referred to herein, embodiments of the invention are not limited to standard Bluetooth. Other embodiments may be used in low power communication systems such as BLE (Bluetooth Low Energy, v4 of the standard); ANT; ZigBee (IEEE802.15.4); BAN (IEEE802.15.6), etc. Low Power systems are used in small devices: bulb; dongle; monitors for sport (e.g. running sensor); etc. These systems are typically inexpensive devices and need to use a minimum of BOM (Bill Of Material), which is provided by using a non-symmetric matching network as described herein.

Embodiments of this disclosure may provide low cost and low power at competitive dynamic ranges with current consumption scalable with respect to dynamic range. This allows a low cost device while retaining significant programmability for multiple applications. Bluetooth provides a secure way to connect and exchange information between devices such as faxes, mobile phones, telephones, laptops, personal computers, printers, Global Positioning System (GPS) receivers, digital cameras, video game consoles, health monitoring devices, etc.

Wireless LAN applications (802.11a/b/g) have a longer range (30-meter) and higher data rate than Bluetooth applications. For 802.11b/g, the direct-sequence spread spectrum (DSSS) is used so that WLAN applications won't interfere with Bluetooth applications in the same frequency range. The orthogonal frequency division multiplexing (OFDM) modulation scheme is used in 802.11a and g to achieve a high data rate, with a stringent requirement on transmitter linearity due to the large peak-to-average ratio of the OFDM modulation. The output power level is medium (around 20 dBm) to cover the 30-meter range with a high data rate. As the demand for wireless multimedia data transmission grows higher, some wide-band technologies and new standards have evolved. Among them are multiple-input multiple-output (MIMO), Ultra-Wide Wide Band (UWB), and Worldwide Interoperability for Microwave Access (WiMAX/802.16). Aspects of the present disclosure may be used in embodiments of transceivers designed for these additional standards and other standards as well.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A system on a chip (SoC) comprising:
   a transceiver having a transmitter and a receiver, at least one of the transmitter and receiver having a single ended mode portion having a single signal line and a differential mode portion having differential signal lines;
   two SoC interface pins for coupling the transceiver to an antenna via an asymmetric matching network, at least one of the two interface pins being coupled to the transmitter and to the receiver signal lines;
   a first tunable capacitor coupled to at least one of the signal lines and having a control input line; and
   a latch having an output coupled to the control input line of the tunable capacitor;
   in which the receiver has the single ended mode portion and the differential mode portion, and the first tunable capacitor is coupled to one differential output of a low noise amplifier of the receiver and a second tunable capacitor is coupled to another differential output of the low noise amplifier.

2. The SoC of claim 1, in which the transmitter has a power amplifier with the single ended mode portion and the differential mode portion.

3. The SoC of claim 1 in which the first tunable capacitor is coupled to one differential signal line, and including a second tunable capacitor coupled to another differential signal line.

4. The SoC of claim 1, in which the first tunable capacitor is coupled across the differential outputs of a power amplifier of the transmitter.

5. The SoC of claim 1, in which the receiver has the single ended mode portion and the differential mode portion, and the first tunable capacitor is coupled to an output of a low noise amplifier of the receiver.

6. The SoC of claim 1 including a microprocessor coupled to the latch.

* * * * *